(12) United States Patent
Glenn et al.

(10) Patent No.: US 6,566,164 B1
(45) Date of Patent: May 20, 2003

(54) EXPOSED COPPER STRAP IN A SEMICONDUCTOR PACKAGE

(75) Inventors: Thomas P. Glenn, Gilbert, AZ (US); Blake A. Gillett, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/733,148

(22) Filed: Dec. 7, 2000

(51) Int. Cl.[7] .............................................. H01L 21/44
(52) U.S. Cl. ...................... 438/107; 438/127; 257/701; 257/778; 257/787
(58) Field of Search ................................ 438/107, 127; 257/701, 787, 778

(56) References Cited

U.S. PATENT DOCUMENTS

| | | | |
|---|---|---|---|
| 4,189,342 A | 2/1980 | Kock | 156/656 |
| 4,935,803 A | 6/1990 | Kalfus et al. | 357/68 |
| 4,942,452 A | 7/1990 | Kitano et al. | 357/68 |
| 4,987,478 A | 1/1991 | Braun et al. | 357/81 |
| 5,041,902 A | 8/1991 | McShane | 357/79 |
| 5,218,231 A | 6/1993 | Kudo | 257/753 |
| 5,266,834 A | 11/1993 | Nishi et al. | 257/706 |
| 5,278,446 A | 1/1994 | Nagaraj et al. | 257/707 |
| 5,328,870 A | 7/1994 | Marrs | 437/216 |
| 5,455,462 A | 10/1995 | Marrs | 257/796 |
| 5,477,160 A | 12/1995 | Love | 324/755 |
| 5,544,412 A | 8/1996 | Romero et al. | 29/832 |
| 5,663,597 A | 9/1997 | Nelson et al. | 257/734 |
| 5,665,996 A | 9/1997 | Williams et al. | 257/401 |
| 5,701,034 A | 12/1997 | Marrs | 257/706 |
| 5,708,567 A | 1/1998 | Shim et al. | 361/723 |
| 5,722,161 A | 3/1998 | Marrs | 29/841 |
| 5,731,709 A * | 3/1998 | Pastore et al. | 324/760 |
| 5,767,527 A | 6/1998 | Yoneda et al. | 257/48 |
| 5,807,768 A | 9/1998 | Shin | 438/127 |
| 5,814,884 A | 9/1998 | Davis et al. | 257/723 |
| 5,854,511 A | 12/1998 | Shin et al. | 257/713 |
| 5,866,949 A * | 2/1999 | Schueller | 257/778 |
| 5,877,043 A | 3/1999 | Alcoe et al. | 438/123 |

(List continued on next page.)

FOREIGN PATENT DOCUMENTS

| | | | |
|---|---|---|---|
| GB | 0720225 A2 | 12/1995 | 23/482 |
| GB | 0720234 A2 | 7/1996 | 29/417 |
| JP | 57-45959 | 3/1982 | |
| JP | 60-116239 | 8/1985 | 21/60 |
| JP | 61-39555 | 2/1986 | |
| JP | 63-233555 | 9/1988 | |
| JP | 8-64634 | 3/1996 | 21/60 |
| WO | WO 88/02929 | 4/1988 | H01L/23/48 |

OTHER PUBLICATIONS

Internet Website Article, Electronic Design—Mar. 22, 1999, vol. 47, No. 6– MOSFETs Break Out Of The Shackles Of Wirebonding.
Provisional Patent Application No. 60/101810.
http://www.siliconix.com, "New Package Technology Yields Nearly Twofold Improvement Over Previous State–of–the–Art," Vishay Siliconix Press Release, Dec. 9, 1998.

*Primary Examiner*—Michael S. Lebentritt
*Assistant Examiner*—Pho M. Luu
(74) *Attorney, Agent, or Firm*—Bever, Hoffman & Harms, LLP; James E. Parsons

(57) ABSTRACT

A semiconductor device includes include a package allowing for increased thermal dissipation. The device includes a power MOSFET die that is electrically connected to a portion of the substrate with a metal strap. The die and at least portions of the strap and substrate are encapsulated in an insulative encapsulant, such as molded plastic. A top surface of the strap is exposed to the environment through the encapsulant. The exposed surface may have grooves formed therein, or fins formed thereon, to facilitate heat transfer.

19 Claims, 5 Drawing Sheets

U.S. PATENT DOCUMENTS

| | | | |
|---|---|---|---|
| 6,028,354 A | 2/2000 | Hoffman | 257/706 |
| 6,040,626 A | 3/2000 | Cheah et al. | 257/735 |
| 6,127,727 A | 10/2000 | Eytcheson | 257/692 |
| 6,144,093 A | 11/2000 | Davis et al. | 257/723 |
| 6,187,611 B1 | 2/2001 | Preston et al. | 438/106 |
| 6,223,429 B1 | 5/2001 | Kaneda et al. | 29/832 |
| 6,229,204 B1 | 5/2001 | Hembree | 256/675 |
| 6,242,283 B1 * | 6/2001 | Lo et al. | 438/106 |
| 6,249,041 B1 | 6/2001 | Kasem et al. | 257/666 |
| 6,252,300 B1 | 6/2001 | Hsuan et al. | 257/686 |
| 6,255,672 B1 | 7/2001 | Yoshioka et al. | 257/107 |
| 6,256,200 B1 | 7/2001 | Lam et al. | 361/704 |
| 6,306,680 B1 * | 10/2001 | Fillion et al. | 438/106 |
| 6,309,916 B1 * | 10/2001 | Crowley et al. | 438/127 |

* cited by examiner

EXPOSED COPPER STRAP IN A SEMICONDUCTOR PACKAGE

RELATED APPLICATIONS

This application is related to U.S. application Ser. No. 09/452,545, now U.S. Pat. No. 6,319,755 entitled "Metal strap Attachment Process That Allows Electrical Connection Between an Integrated Circuit Die and a Lead frame" filed Dec. 1, 1999; U.S. application Ser. No. 09/536,236, U.S. Pat. No. 6,459,147 entitled "Attaching Semiconductor Dies to Substrates with Metal straps", filed Mar. 27, 2000; and U.S. application Ser. No. 09/587,136, entitled "Packaging High Power Integrated Circuit Devices", filed Jun. 2, 2000. All of these applications are incorporated herein by reference in their entireties.

BACKGROUND

1. Technical Field

This invention is related to the packaging of semiconductor dies in general and, in particular, to a method and apparatus for connecting the die of a high power semiconductor device to an associated substrate with a metal strap that is exposed through a protective body of material encapsulating the entire assembly, thus providing for low electrical resistance and high thermal dissipation.

2. Related Art

FIGS. 1 and 2 are top plan and side elevation views, respectively, of a prior art embodiment of an 8-lead standard outline integrated circuit ("SOIC-8") lead frame-type of power MOSFET semiconductor device 10 that has a conductive metal strap 12 electrically connecting a semiconductor die 14 to a metal portion 16B of a lead-frame-type substrate 16.

In the exemplary prior art MOSFET device 10 of FIGS. 1 and 2, the drain terminals of one or more individual MOSFETs (not visualized) formed in the die 14 are electrically connected to a metal or polysilicon first conductive layer 23 located on a downwardly-oriented first surface of the die. First conductive layer 23 of is, in turn, electrically connected to the metal die paddle 20 of a first portion 16A of the lead frame 16 by, e.g., a layer 22 of solder or an electrically conductive adhesive. The die paddle 20 is integrally connected to each of four leads (5–8) of the first portion 16A in this embodiment.

The source terminals of the one or more individual MOSFETs in the die 14 are connected to a metal or polysilicon second conductive layer 24 (FIG. 2) on an opposing upwardly oriented second surface of the die. The second conductive layer 24 on the die 14 is electrically connected to a second portion 16B of substrate 16 through an electrically conductive layer 36, metal strap 12, and electrically conductive layer 38. Second portion 16B includes leads 1–3 in this embodiment.

The strap 12 comprises a planar cover portion 30 at an inner first end thereof, a planar flange portion 34 at an opposite outer second end thereof, and an oblique connection portion 32 between cover portion 30 and flange portion 34. Cover portion 30 includes a first surface 30a that is electrically connected to the second conductive layer 24 by electrically conductive layer 36, and an opposite second surface 30b that faces toward the top of the package when oriented as shown in FIG. 2. Second surface 30b and all other portions of strap 12 are covered by encapsulant 18. The flange portion 34 of the strap 12 connects to the second portion 16B of the substrate 16 by a lap joint using an electrically conductive layer 38.

The metal strap 12 is made of a conductive metal, typically copper or a copper alloy. As illustrated in FIG. 2, with the device 10 oriented as shown, the first surface 30a of the cover 30 and bottom surface of flange 34 portions of the strap 12 lap over the top surfaces of the die 14 and the second portion 16B of the substrate 16, respectively, and are respectively joined thereto with layers 36, 38 of, e.g., solder or an electrically conductive epoxy.

The gate terminals of the individual MOSFETs are connected to a third conductive layer, or gate pad 26, located on the upper second surface of the die 14 (i.e., the same surface of die 14 as second conductive layer 24). The gate pad 26, which is electrically isolated from the second conductive layer 24, is electrically connected to a third portion 16C of substrate 16 by a bond wire 28 (see FIG. 1). Third portion 16C includes a lead 4, and is electrically isolated from, but coplanar with, first and second portions 16A and 16B of substrate 16.

Encapsulant 18 fully encloses die 14 and metal strap 12, and encloses a portion of the lead frame substrate 16, leaving the ends of leads 1–8 exposed for connection to other circuit components. Encapsulant 18 is typically molded plastic.

Pertinent dimensions of device 10 include: an area of die 14 that is 2 by 2 to 8 by 8 mm×mm; a height of die 14 that is 0.2 to 0.3 mm; a height of cover portion 30 that is 0.1 to 0.2 mm; and a thickness of encapsulant 18 above second surface 30b that is 0.1 to 0.3 mm. The width of strap 12 is primarily a function of the area of die 14 and second conductive layer 24. The length of strap 12 is a function of the area of die 14 and second conductive layer 24 and the closeness of paddle 20 to second portion 16B of substrate 16.

Metal strap 12 of device 10 provides for improved thermal dissipation characteristics and lower electrical resistance in comparison to earlier configurations in which bond wires were used rather than metal strap 12. Despite the improvements offered by the use of metal strap 12, however, a need exists for a method and apparatus that provides an even greater degree of heat dissipation.

SUMMARY OF THE INVENTION

The present invention provides methods and apparatuses for packaging a semiconductor die. Among other features, the packages provide increased heat dissipation capabilities compared to prior art designs.

In one embodiment of a semiconductor device within the present invention, a high power semiconductor die is electrically connected to a substrate on which the die is mounted, e.g., a lead frame, with a metal strap. The die, substrate, and metal strap are encapsulated by an insulative, protective body in such a way that a portion of the metal strap is exposed to the outside environment. The exposed surface allows for increased thermal dissipation and less heat buildup during operation of the device.

An exemplary method for making such a package includes the provision of a semiconductor die, an interconnective substrate, and a conductive metal strap. After the die, substrate, and metal strap are electrically interconnected, an insulative encapsulant is provided (e.g., by molding) over the die and portions of the substrate and strap in a manner that leaves an upper surface of the strap above the die exposed to the environment. In other embodiments, recesses may be formed in the exposed surface of the strap to further increase heat dissipation. In a further alternative embodiment, heat-radiating metal protrusions may be formed on, or fastened to, the exposed surface of the metal strap.

The present invention is also applicable to other types of semiconductor devices. In one embodiment, a first surface of a metal strap is thermally connected, but not electrically connected, to an active surface of a memory, logic, or microprocessor die within rows of edge bond pads formed on the active surface of the die. An opposite surface of the strap is exposed to ambient through the encapsulant, which results in improved thermal dissipation.

These and other aspects of the present invention may be better understood in view of the accompanying drawings and the following detailed description.

DETAILED DESCRIPTION

Figure 1:
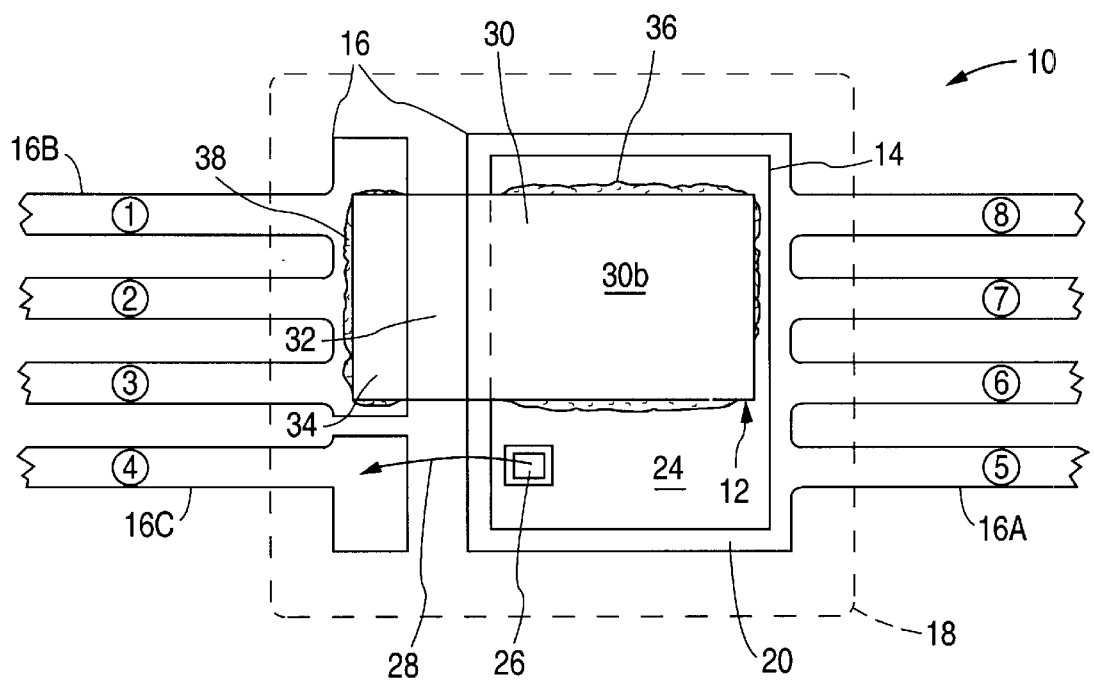
FIGS. 1 and 2 are top plan and side elevation views, respectively, of a conventional power semiconductor device having a fully encapsulated metal strap that electrically connects a power MOSFET die therein to a substrate.
Figure 2:
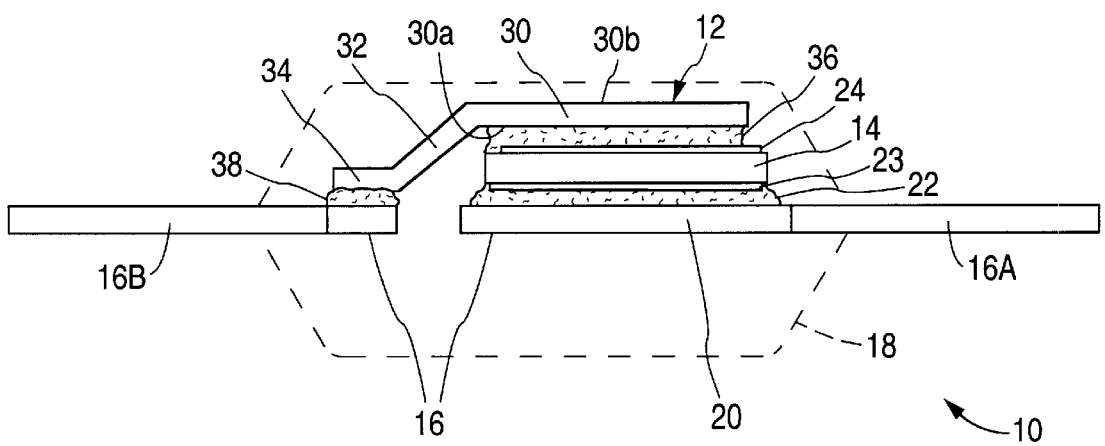
Figure 3:
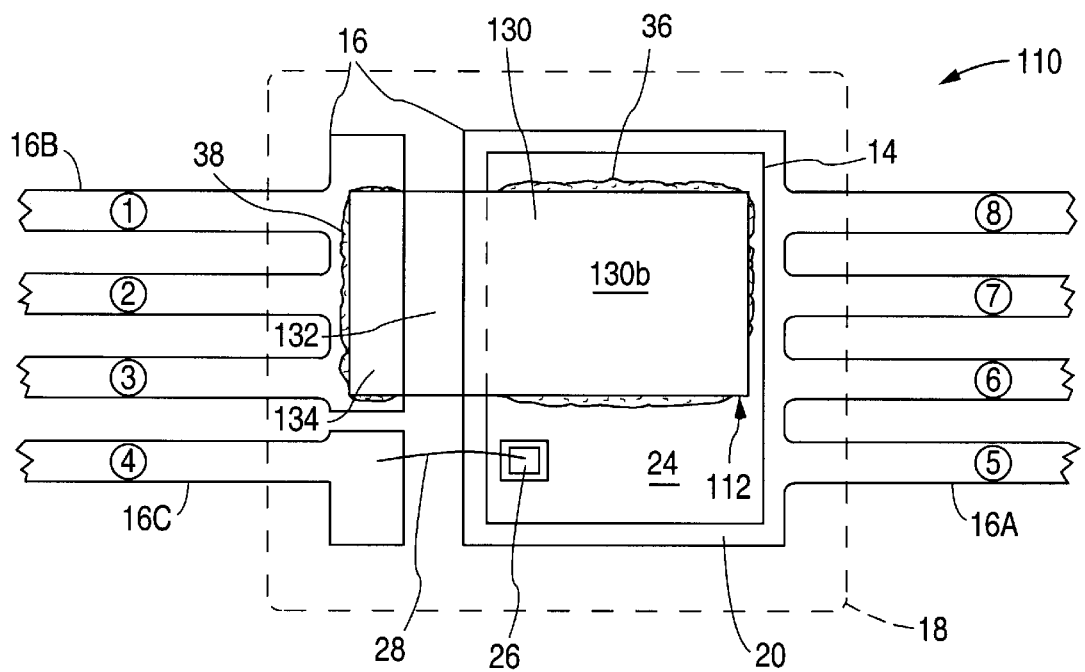
FIGS. 3 and 4 are top plan and side elevation views, respectively, of a semiconductor device having an exposed metal strap in accordance with one embodiment of the present invention.
Figure 4:
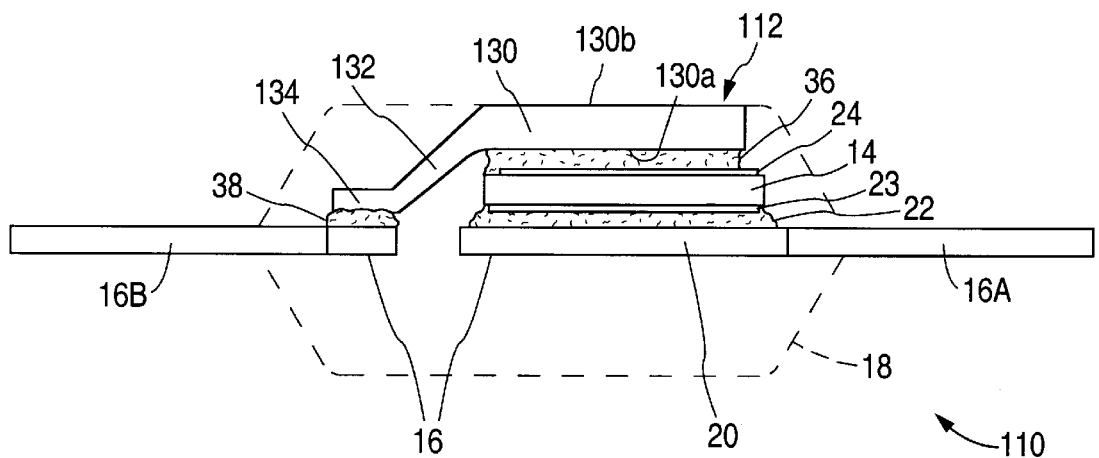

FIGS. 3 and 4 show a first embodiment of a semiconductor device 110 within the present invention. The exemplar package has many of the same features as shown in FIGS. 1 and 2, except for changes to the metal strap 12. Elements similar to those in the prior art device 10 illustrated in FIGS. 1 and 2 are given the same identifying reference number.

Metal strap 112 of FIGS. 3 and 4 has a thicker cover portion 130 than strap 12 of FIGS. 1 and 2. Because cover portion 130 is thicker than cover portion 30 of FIGS. 1 and 2, surface 130b of cover portion 130 is exposed through the nonconductive encapsulating body 118. The exposed second surface 130b of cover portion 130 radiates heat effectively to the exterior. In this instance, second surface 130b is fully planar and is in the plane of the planar top surface of body 118. For instance, where cover portion 30 of FIG. 2 had a height of between 0.1 to 0.2 mm, cover portion 130 may have a height of between 0.2 and 0.5 mm.

The method of making device 110 of FIGS. 3 and 4 is similar to the above described method of making device 10, except for the molding step. Die 14 of FIG. 3 is mounted on and electrically connected to die paddle 20 of first portion 16A of substrate 16 and strap 112 is electrically and thermally connected to second conductive layer 24 of die 14 with an electrically and thermally conductive layer 36 (e.g., solder or silver-filled epoxy). Subsequently, encapsulant 18 is molded in such a way that second surface 130b of the cover portion 130 is exposed through an exterior surface of the plastic encapsulant 118. This may be accomplished by abutting second surface 130b of cover portion 130 of strap 112 against an inner wall of the top pocket of the mold. Assuming that one wishes to use the same mold for making device 110 of FIGS. 3 and 4 as for making device 10 of FIGS. 1 and 2, the thickness of cover portion 130 is made to be sufficient to allow cover portion 130 to abut the inner wall of the mold pocket.

In an alternative embodiment, strap 12 of FIGS. 1 and 2 is used, but the thickness of encapsulant 18 above second surface 30b of cover portion 30 is reduced so that second surface 30b is exposed. This typically would require a shallower mold or some sort of a shim within the mold used to make device 10 of FIG. 1.

Figure 5:
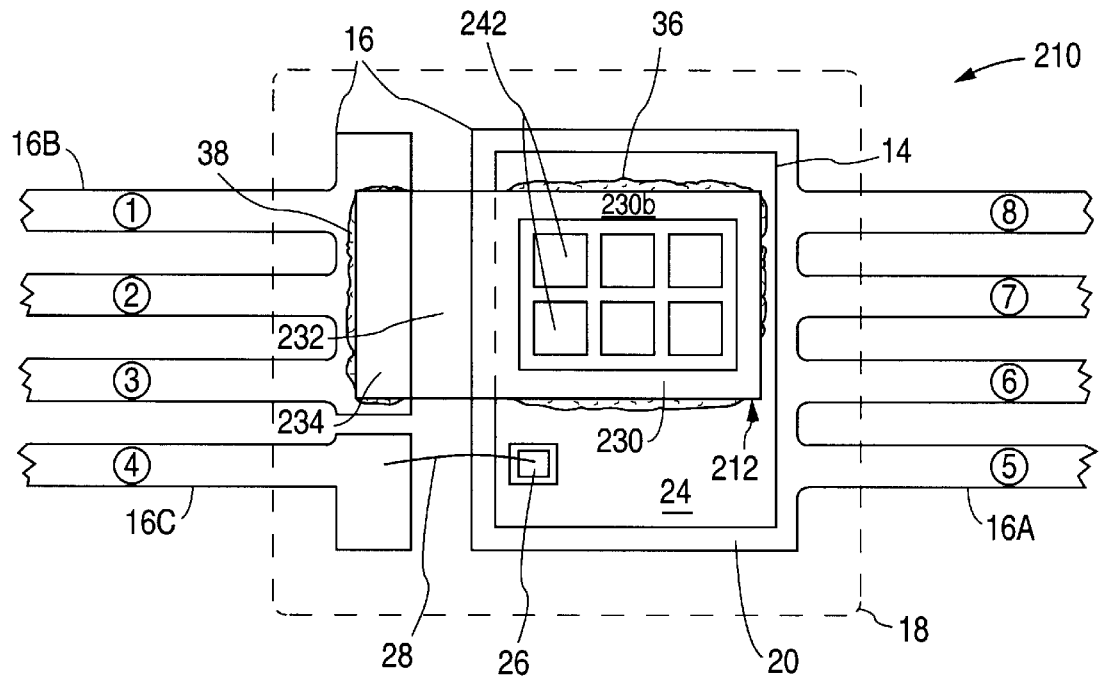
FIG. 5 is a top plan view of a semiconductor device having an exposed metal strap in accordance with a second embodiment of the present invention, wherein recesses are formed in the exposed surface of the metal strap.

FIG. 5 shows the top plan view of a semiconductor device 210 in accordance with another embodiment of the present invention. A side elevation view is not shown but, similar to what is shown in FIG. 4, metal strap 212 has a thicker cover portion 230 than the prior art cover portion 30 of FIG. 1.

In addition, a matrix of square recesses 242 are formed in the exposed second surface 230b of the cover portion 230 of FIG. 5. Recesses 242 increase the surface area of cover portion 230 that is exposed to ambient for increased heat dissipation. Although a waffle pattern of recesses is shown, it is to be understood that the number of recesses, and their particular shape, orientation and dimensions can vary.

Figure 6:
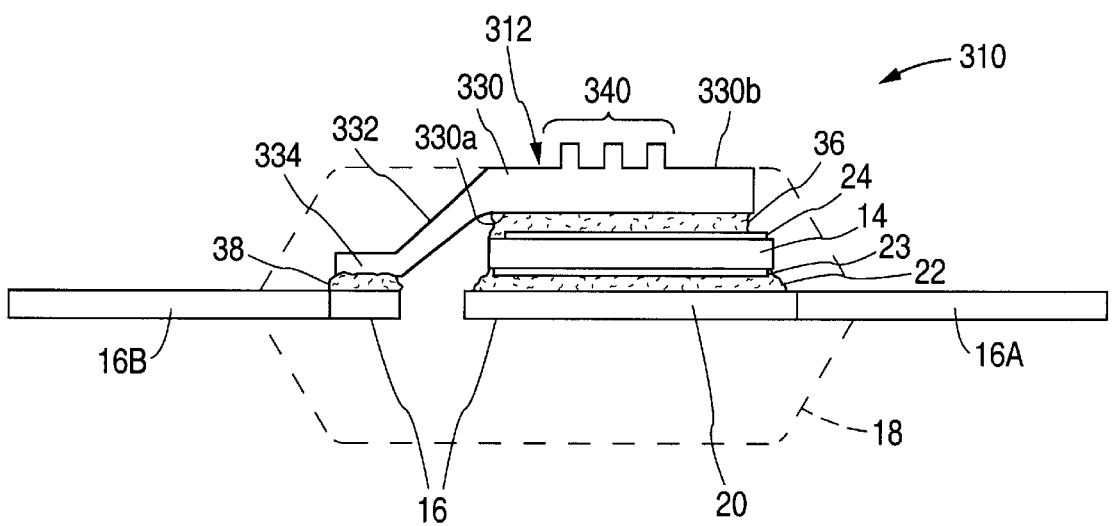
FIG. 6 is a side elevation view of a semiconductor device having an exposed metal strap in accordance with a third embodiment of the present invention, wherein heat-radiating protrusions are formed on the exposed surface of the metal strap.

FIG. 6 shows a side elevation view of a packaged semiconductor device 310 of another embodiment of the present invention. In this case, similar to the embodiment illustrated in FIGS. 3 and 4, the metal strap 312 has a thicker cover portion 330 than the prior art device shown in FIGS. 1 and 2, and second surface 330b of the cover portion 330 is exposed through the top of encapsulant 18. In addition, fin-like vertical protrusions 340 are formed on (or attached to) the exposed surface of the cover strap 330 and extend vertically from second surface 330b for increased heat dissipation. Once again, the number, shape, size, and orientation of the protrusions may vary in other embodiments.

Figure 7:
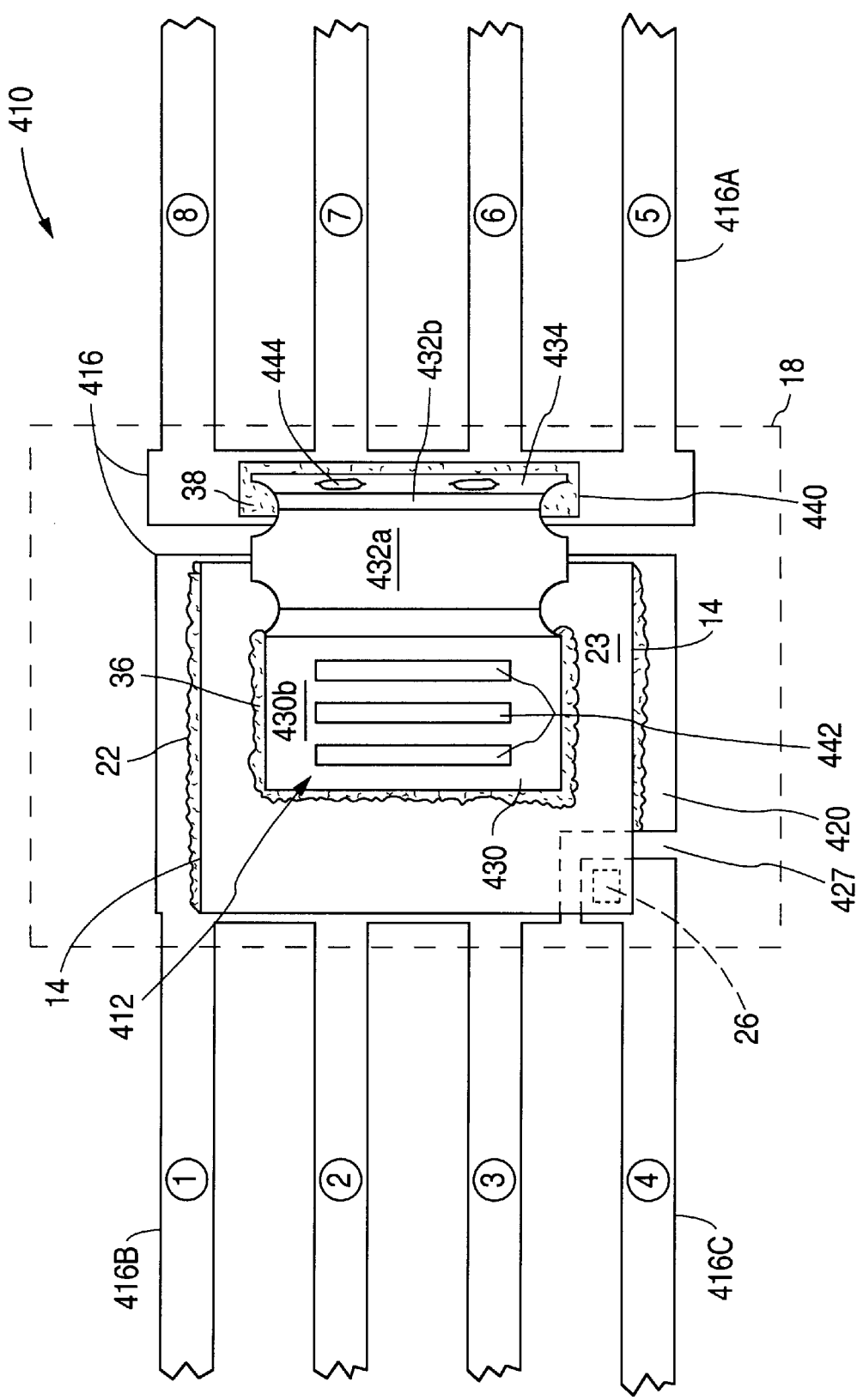
FIG. 7 is a top plan view of a semiconductor device having an exposed metal strap in accordance with a fourth embodiment of the present invention.

Another exemplary embodiment of the present invention is illustrated in FIG. 7. FIG. 7 shows a high power semiconductor device 410. The differences between the embodiment of FIG. 7 and the embodiment of FIGS. 3 and 4 include that, in FIG. 7, the die is inverted. In addition, the substrate is rearranged. As a result, bond wire 28 of FIG. 1 is eliminated.

Die 14 of FIG. 7 is a power MOSFET or some other three terminal device. Alternatively, a two terminal device such a diode may be provided, which would eliminate the need for third portion 416C of substrate 16.

As mentioned above, die 14 is inverted in FIG. 7 so that second conductive layer 24 (i.e., the source terminals) (not shown) faces and is electrically connected by conductive layer 22 to the juxtaposed die paddle 420 of second portion 416B of substrate 416, which includes integrally connected leads 1–3. The gate pad 26 faces and is electrically connected to a juxtaposed extension of third portion 416C of substrate 416. Third portion 416C is coplanar with, but electrically isolated from, first and second portions 416A and 416B of substrate 416. Third portion 416C includes a lead 4 that is electrically isolated from leads 1–3 and 5–8.

First conductive layer 23 (i.e., the drain terminals) faces the top of the package in the embodiment of FIG. 7. First conductive layer 23 is electrically and thermally connected by an electrically and thermally conductive layer 36 (which may be solder or a filled electrically and thermally conductive epoxy or other adhesive) to planar first surface 430a (not shown) of cover portion 430 of strap 412. The opposing second surface 430b of cover portion 430 is exposed at the top of the package through the encapsulating body 18. Recesses 442 are provided in the form of three parallel rectilinear grooves that extend across second surface 430b of cover portion 430. Recesses 442 increase the heat dissipation from cover portion 430 due to increased surface area and exposure to ambient. As above, the number, orientation, and dimensions of recesses 442 will vary. For example, the grooves may have tapered sidewalls. Alternatively, vertical fins may be provided on second surface 430b, as in FIG. 6.

Metal strap 412 of FIG. 7 includes a flange portion 434 opposite cover portion 430 and a connector portion that is between flange portion 434 and cover portion 430. The connector portion has an inner horizontal portion 432a and an outer oblique portion 432b in this embodiment. Flange portion 434 is electrically connected to first portion 416A of the substrate 416 by a conductive layer 38 (e.g., solder or a conductive adhesive such as silver-filled epoxy). First substrate portion 416A includes one or more integrally connected leads (leads 5–8 in the embodiment illustrated).

To increase the reliability of the connection between flange portion 434 and first portion 416A, flange portion 434 is set in a recess 440 that is formed in the upper surface of first portion 416A of substrate 416. Conductive layer 38 attaches flange portion 434 to first portion 416A within recess 440. A hole 444 is formed through flange portion 434 so that the material of layer 38 can wick upwards, thereby forming a key in hole 444. Accordingly, a strong bond is formed.

The above examples of the present invention involved power devices, wherein the encapsulated die has conductive layers on its top and bottom surfaces that are electrically connected to the substrate and serve as input and output terminals for the device. However, the present invention also applies to other types of semiconductor devices, such as memory, logic, or microprocessor devices, that have an active surface with bond pads thereon and an opposing inactive surface.

Figure 8:
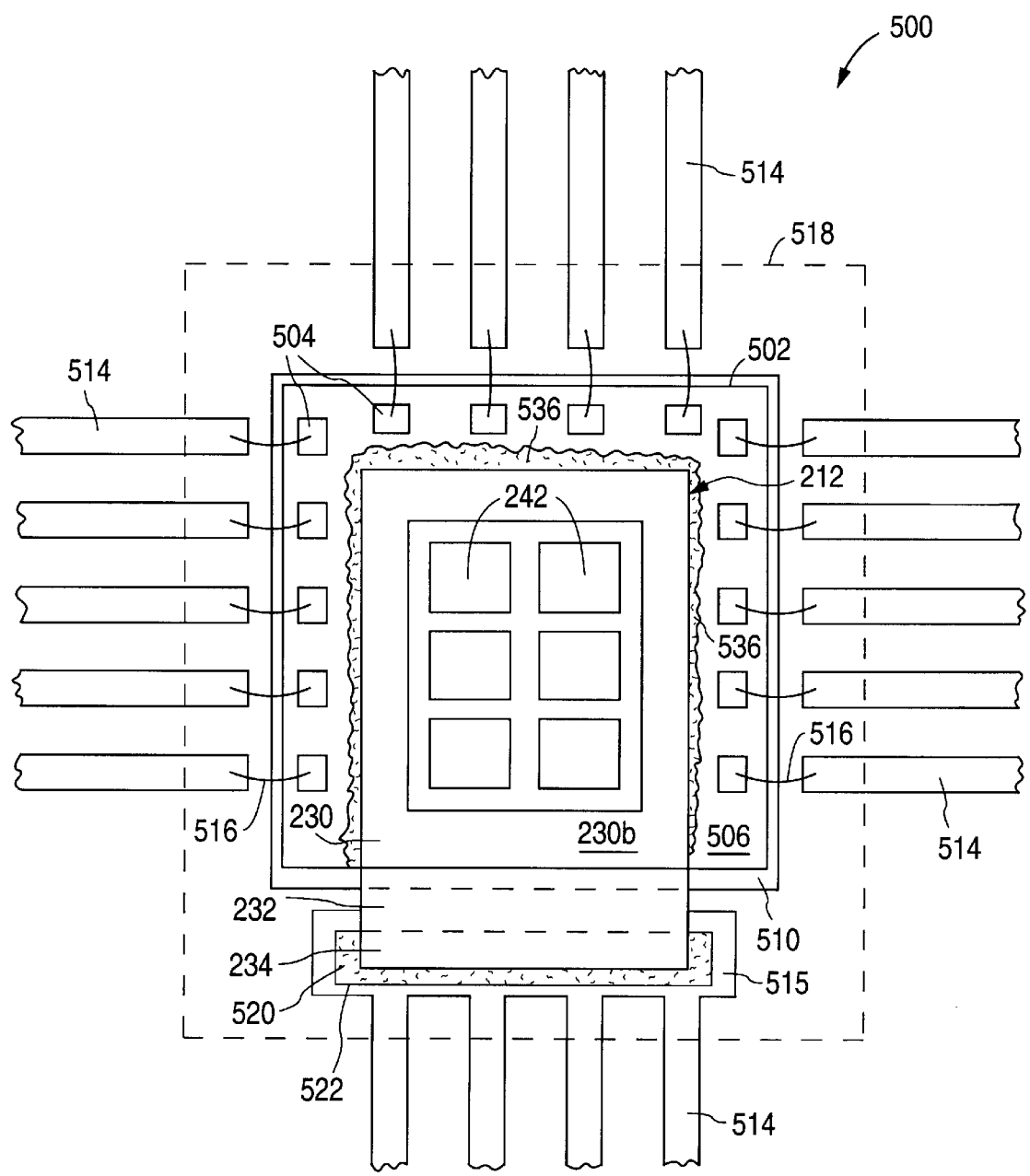
FIG. 8 is a top plan view of a semiconductor device having an exposed metal strap in accordance with a fifth embodiment of the present invention.

For example, FIG. 8 is a top plan view of a semiconductor device 500 having an exposed metal strap 212, comprised of 230b, 232 and 234 as shown in FIG. 5. Device 500 includes a semiconductor die 502 having several discrete conductive edge bond pads 504 on active upper first surface 506 of die 502. An opposite inactive lower second surface (not shown) of die 502 is attached to a planar metal die pad 510 using adhesive 513, which may be electrically and/or thermally conductive.

A plurality of leads 514 surround die 502. Conductive wires 516 electrically connect some of the individual leads 514 to individual bond pads 504, thereby providing input and output paths for die 502.

Metal strap 212 comprised of 230b, 232 and 234 of FIG. 8 is thermally connected to die 502 and some of the leads 514. In particular, first surface 230a (not shown) of cover portion 230 of strap 212 is connected to first surface 506 of die 502 through a thermally conductive, but not electrically conductive, adhesive layer 536 that is attached to an insulated area of first surface 506 of die 502. Layer 536 may be diamond filled epoxy or an epoxy filled with some other thermally conductive, but not electrically conductive, material. An opposite second surface 230b of cover portion 230 is exposed at the top of the package through encapsulant 518. Accordingly, strap 212 conducts heat away from die 502 through exposed upper surface 230b of cover portion 230 of strap 212. In addition, flange portion 234 of strap 212 is thermally connected to a metal bar 515, which in turn is integrally connected to four leads 514. Similar to FIG. 7, flange portion 234 is positioned in a groove 522 in bar 515, and is thermally attached to bar 512 with a thermally conductive adhesive 520. The opposing ends of the leads 514 extending from bar 515 may be thermally connected to a grounded heat sink.

Many variations and modifications can be made in the materials and methods of this invention without departing from its true scope and spirit. For example, in an alternative embodiment, the lead frame substrate of FIGS. 3–7 may be replaced by a single-piece, laminated substrate, such as a multi-layer printed circuit board ("PCB"), formed of layers of, e.g., epoxy-impregnated fiberglass and copper, with etched metal traces replacing the leads 1–8. Solder balls typically are fused to metallizations on the lower exposed surface of the PCB. Vias through the substrate electrically connect the solder balls to the metal traces. Accordingly, leads equivalent to leads 1–8 are formed of FIGS. 1–7 are formed.

In addition, the methods described above are fully compatible with the techniques of high volume device production in which a plurality of identical devices are fabricated simultaneously in the form of a connected strip or array of devices that is subsequently encapsulated, and then cut apart, or "singulated," into individual devices.

Accordingly, the scope of the invention should not be limited to that of the particular embodiments illustrated and described herein, as they are merely exemplary in nature, but rather, should encompass that of the claims appended hereafter and their substantial equivalents.

What is claimed is:

1. A semiconductor device, comprising:
  a substrate having at least coplanar first and second portions each including one or more leads, wherein each said portion is electrically isolated from each other said portion;
  a semiconductor die having a first terminal electrically connected to a first conductive layer on a first surface of the die, and a second terminal electrically connected to a second conductive layer on an opposite second surface of the die, wherein the first conductive layer faces and is attached to the first portion of the substrate by an electrically conductive material;
  a metal strap having a cover portion at a first end thereof and an opposite second end portion, the cover portion having a first surface and an opposite second surface, wherein the first surface of the cover portion is attached to the second conductive layer of the die with an electrically and thermally conductive material, and the second end portion is attached to the second portion of the substrate with an electrically conductive material; and,
  a body of nonconductive encapsulant material encapsulating the semiconductor die and at least a portion of the substrate, wherein the second surface of the cover portion of the metal strap is exposed through the encapsulant material.

2. The semiconductor device of claim 1, wherein the exposed second surface of the cover portion of the metal strap is entirely planar with the body of the nonconductive encapsulant material.

3. The semiconductor device of claim 1, wherein the exposed second surface of the cover portion of the metal strap includes one or more recesses.

4. The semiconductor device of claim 1, wherein the exposed second surface of the cover portion includes one or more protrusions that extend vertically from the second surface.

5. The semiconductor device of claim 1, wherein the second end portion of the strap has an aperture therein, and wherein the electrically conductive material attached between the second end portion of the strap and the second portion of the substrate fills said aperture.

6. The semiconductor device of claim 1, wherein the second portion of the substrate has a recess therein, and the second end portion of the strap is attached to said second portion of the substrate within the recess.

7. The semiconductor device of claim 1, wherein the die has a third conductive layer on the second surface of the die that is electrically isolated from the second conductive layer and is electrically connected to a third terminal of the die, the substrate has a third portion including at least one lead, said third portion being coplanar with the first and second portions but electrically isolated therefrom, and said third conductive layer is electrically connected to the third portion of the substrate with a wire bond.

8. The semiconductor device of claim 1, wherein the die has a third conductive layer on the first of surface of the die that is electrically isolated from the first conductive layer and is electrically connected to a third terminal of the die, the substrate has a third portion including at least one lead, said third portion being coplanar with the first and second portions but electrically isolated therefrom, and said third conductive layer faces and is electrically connected to the third portion of the substrate.

9. The packaged semiconductor device of claim 1, wherein the substrate comprises a metal lead frame or a printed circuit board.

10. A semiconductor device, comprising:

a substrate having a plurality of leads and a die mounting region;

a semiconductor die having a plurality of conductive bond pads on an active first surface thereof and an opposite inactive second surface, wherein the second surface is mounted on the die mounting region;

a plurality of electrical conductors, wherein each conductor is electrically connected between a lead and a bond pad on the first surface of the die;

a metal strap having a cover portion at a first end thereof and an opposite second end portion, the cover portion having a first surface and an opposite second surface, wherein the first surface of the cover portion is attached to the first surface of the die with a thermally conductive nonelectrically conductive first material, and the second end portion of the strap is attached to one or more leads with a thermally conductive second material; and, a body of nonconductive encapsulant material encapsulating the semiconductor die and at least a portion of the substrate, wherein the second surface of the cover portion of the strap is exposed through the encapsulant material.

11. The semiconductor device of claim 10, wherein the exposed second surface of the cover portion of the metal strap includes one or more recesses.

12. The semiconductor device of claim 10, wherein the exposed second surface of the cover portion includes one or more protrusions that extend vertically from the second surface.

13. The semiconductor device of claim 10, wherein the second end portion of the strap has an aperture therein, and wherein the thermally conductive material attached between the second end portion of the strap and the second portion of the substrate fills said aperture.

14. The semiconductor device of claim 10, wherein the second portion of the substrate has a recess therein, and the second end portion of the strap is attached to said second portion of the substrate within the recess.

15. A semiconductor device comprising:

a substrate having a first portion and a second portion each including one or more leads;

a semiconductor die comprising a first terminal and second terminal, wherein the first terminal superimposes and is electrically coupled to the first portion of said substrate;

a metal strap having a cover portion at a first end thereof and an opposite second end portion, the cover portion having a first side and an opposite second side, wherein the first side of the cover portion is electrically and thermally coupled to the second terminal of the semiconductor die and the second end portion is electrically coupled to the second portion of the substrate; and, a body of a nonconductive encapsulant material encapsulating the semiconductor die and at least a portion of the substrate, wherein a non-planar portion of the second side of the cover portion of the metal strap is exposed through the encapsulant material.

16. The semiconductor device of claim 15, wherein the non-planar portion of the second side includes one or more recesses.

17. The semiconductor device of claim 15, wherein the non-planar portion of the second side includes one or more protrusions extending from the second side.

18. The semiconductor device of claim 15, wherein the semiconductor die is a power MOSFET, and the substrate is a metal lead frame.

19. The semiconductor device of claim 15, wherein the substrate is a metal lead frame or a printed circuit board.

* * * * *